United States Patent
Ogawa et al.

(10) Patent No.: US 10,026,628 B2
(45) Date of Patent: Jul. 17, 2018

(54) SEMICONDUCTOR SUBSTRATE CLEANING METHOD AND CLEANING SYSTEM

(71) Applicant: KURITA WATER INDUSTRIES LTD., Tokyo (JP)

(72) Inventors: Yuichi Ogawa, Tokyo (JP); Haruyoshi Yamakawa, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 388 days.

(21) Appl. No.: 14/432,818

(22) PCT Filed: Sep. 30, 2013

(86) PCT No.: PCT/JP2013/076529
§ 371 (c)(1),
(2) Date: Apr. 1, 2015

(87) PCT Pub. No.: WO2014/054576
PCT Pub. Date: Apr. 10, 2014

(65) Prior Publication Data
US 2015/0279703 A1 Oct. 1, 2015

(30) Foreign Application Priority Data
Oct. 2, 2012 (JP) .................................. 2012-220816

(51) Int. Cl.
*C23G 1/02* (2006.01)
*H01L 21/67* (2006.01)
(Continued)

(52) U.S. Cl.
CPC .. *H01L 21/67051* (2013.01); *H01L 21/02068* (2013.01); *H01L 21/32134* (2013.01); *H01L 21/28518* (2013.01)

(58) Field of Classification Search
None
See application file for complete search history.

(56) References Cited

U.S. PATENT DOCUMENTS

2003/0144163 A1 7/2003 Morinaga et al.
2005/0176604 A1 8/2005 Lee
(Continued)

FOREIGN PATENT DOCUMENTS

CN 1420161 A 5/2003
CN 1654713 A 8/2005
(Continued)

OTHER PUBLICATIONS

EPO machine translation of JP2005236280 retrieved from https://worldwide.espacenet.com/publicationDetails/biblio?ll=1&ND=3&adjacent=true&locale=en_EP&FT=D&date=20050902&CC=JP&NR=2005236280A&KC=A on Aug. 25, 2017.*
(Continued)

*Primary Examiner* — Eric W Golightly
(74) *Attorney, Agent, or Firm* — Scarinci & Hollenbeck

(57) ABSTRACT

The present invention relates to a method and a system for cleaning a semiconductor substrate wherein Al is at last partially exposed on a silicon substrate and silicided with a metallic substance without damaging the Al and a silicide layer. A cleaning portion cleans the aforementioned semiconductor substrate. A delivery portion, disposed on the cleaning portion, delivers a solution to the semiconductor substrate. A sulfuric acid solution transfer path connected onto the delivery portion transfers a sulfuric acid solution and an adsorptive inhibitor solution transfer path connected to the delivery path transfers an adsorptive inhibitor having any one or more of N-based, S-based, and P-based polar groups to the delivery portion. The sulfuric acid solution and the adsorptive inhibitor may be mixed or separately transferred to come into contact with the semiconductor substrate.

13 Claims, 5 Drawing Sheets

(51) Int. Cl.
*H01L 21/02* (2006.01)
*H01L 21/3213* (2006.01)
*H01L 21/285* (2006.01)

(56) References Cited

U.S. PATENT DOCUMENTS

2007/0135322 A1   6/2007   Morinaga et al.
2008/0214006 A1   9/2008   Lee

FOREIGN PATENT DOCUMENTS

| | | |
|---|---|---|
| DE | 102005004401 A1 | 12/2005 |
| EP | 1342777 A1 | 9/2003 |
| JP | 2001-308052 A | 11/2001 |
| JP | 2002-124487 A | 4/2002 |
| JP | 2003-221600 A | 8/2003 |
| JP | 2005-236280 A1 | 9/2005 |
| JP | 2008-118088 A | 5/2008 |
| JP | 2008-160116 A | 7/2008 |
| JP | 2008-258487 A | 10/2008 |
| JP | 2009-535846 A | 10/2009 |
| JP | 2010-157684 A | 7/2010 |
| KR | 10-2003-0041092 A | 5/2003 |
| KR | 10-2005-0080729 A | 8/2005 |
| TW | 276682 B | 3/2007 |

OTHER PUBLICATIONS

International Search Report from PCT/JP2013/076529 dated Dec. 17, 2013.

\* cited by examiner

1c

SEMICONDUCTOR SUBSTRATE CLEANING METHOD AND CLEANING SYSTEM

CROSS-REFERENCE TO RELATED APPLICATIONS

The present application is the U.S. National Phase of International Application No. PCT/JP2013/076529, filed on Sep. 30, 2013, and claims priority to Japanese patent application No. 2012-220816, filed on Oct. 2, 2012, which are incorporated herein by reference in their entirety.

TECHNICAL FIELD

The present invention relates to a semiconductor substrate cleaning method and cleaning system for cleaning a semiconductor substrate on which Al is present and which is silicided.

BACKGROUND

In recent years, in a transistor formation process, in order to reduce the resistance of the source and the drain, silicidation has been performed using a material such as Ni or Co to form NiSi or CoSi, respectively. In addition, for the reduction of junction leak current, an alloy in which 5 to 10% Pt or Pd is mixed into Ni or Co has been used. Especially, when NiPt is used, the improvement of heat resistance and a junction leak current suppression effect are expected. (see Patent Literatures 1 and 2)

In a silicidation step, by forming an alloy into a film on a Si substrate and then subjecting the alloy to thermal oxidation treatment, the alloy reacts with Si to form a silicide, but the remaining unreacted alloy needs to be removed. For example, a method using SPM (a mixed liquid of sulfuric acid and hydrogen peroxide) in order to remove unreacted NiPt after NiPt silicide formation is known. (see Patent Literatures 3 and 4)

In addition, as a cleaning method for dissolving NiPt, a method using aqua regia is known (see Patent Literature 5).

In addition, a method of treatment with a sulfuric acid-based oxidant followed by treatment with hydrochloric acid-based oxidant is proposed (see Patent Literature 6).

In addition, a method is known which uses a hydrogen peroxide solution, ozone water, or electrolyzed anode water in order to clean a semiconductor substrate while suppressing the corrosion of a metal film in cleaning the semiconductor substrate having the metal film (see Patent Literature 7), but the cleaning ability is insufficient for unreacted NiPt removal after silicide formation.

CITATION LIST

Patent Literature

Patent Literature 1: Japanese Patent Laid-Open No. 2008-258487
Patent Literature 2: Japanese Patent Laid-Open No. 2008-160116
Patent Literature 3: Japanese Patent Laid-Open No. 2002-124487
Patent Literature 4: National Publication of International Patent Application No. 2008-118088
Patent Literature 5: National Publication of International Patent Application No. 2009-535846
Patent Literature 6: Japanese Patent Laid-Open No. 2010-157684
Patent Literature 7: Japanese Patent Laid-Open No. 2001-308052

SUMMARY OF INVENTION

Technical Problem

But, in the method using SPM among conventional methods, when the blending ratio of hydrogen peroxide is increased, NiPt can be dissolved, but at this time, Al, which must not be etched, is also dissolved.

In addition, in the method using aqua regia, the aqua regia harms the silicide film.

Further, in the method of treatment with a sulfuric acid-based oxidant followed by treatment with hydrochloric acid-based oxidant, treatment is performed in two stages, and therefore, problems are that it takes time and the operation is complicated compared with one-agent treatment.

The present invention has been made with the above circumstances as a background, and it is an object of the present invention to provide a semiconductor substrate cleaning method and cleaning system that can effectively perform cleaning without damaging Al and a silicide film in cleaning a semiconductor substrate in which Al is present and which is silicided.

Solution to Problem

Specifically, of the semiconductor substrate cleaning methods of the present invention, the first present invention is a method for cleaning a semiconductor substrate in which Al is at least partially exposed on a silicon substrate and which is silicided with a metallic substance, comprising:

bringing the semiconductor substrate into contact with a first solution comprising one or more adsorptive inhibitors having any one or more of N-based, S-based, and P-based polar groups; and cleaning the semiconductor substrate with a second solution comprising as a cleaning component a sulfuric acid solution comprising an oxidant.

The semiconductor substrate cleaning method of the second present invention is the semiconductor substrate cleaning method according to the first present invention, wherein a concentration of the oxidant during the cleaning is 0.001 to 2 mol/L.

The semiconductor substrate cleaning method of the third present invention is the semiconductor substrate cleaning method according to the first or the second present invention, wherein for the first solution and the second solution, the first solution is first started to be used, and then, the second solution is used in the presence of the first solution, or the first solution and the second solution are mixed and used.

The semiconductor substrate cleaning method of the fourth present invention is the semiconductor substrate cleaning method according to the third present invention, wherein in mixing of the first solution and the second solution, the first solution and the second solution are mixed to provide a mixed solution before being brought into contact with the semiconductor substrate, or the first solution and the second solution are supplied to the semiconductor substrate through separate paths and mixed with each other on the semiconductor substrate.

The semiconductor substrate cleaning method of the fifth present invention is the semiconductor substrate cleaning method according to any of the first to fourth present inventions, wherein the metallic substance is any one or more selected from the group consisting of Ti, V, Cr, Co, Ni, Fe, Zr, Nb, Mo, Pd, Pt, Hf, Ta, W, and Ir.

The semiconductor substrate cleaning method of the sixth present invention is the semiconductor substrate cleaning method according to the fifth present invention, wherein one of the metallic substance is Pt or an alloy thereof.

The semiconductor substrate cleaning method of the seventh present invention is the semiconductor substrate cleaning method according to the sixth present invention, wherein at least one of the adsorptive inhibitors has complexing ability with Pt.

The semiconductor substrate cleaning method of the eighth present invention is the semiconductor substrate cleaning method according to the seventh present invention, wherein at least one of the adsorptive inhibitors has chelating ability with Pt.

The semiconductor substrate cleaning method of the ninth present invention is the semiconductor substrate cleaning method according to the eighth present invention, wherein at least one of the adsorptive inhibitors has a phosphonic acid group.

The semiconductor substrate cleaning method of the tenth present invention is the semiconductor substrate cleaning method according to the ninth present invention, wherein the adsorptive inhibitor is any of NTMP (Nitrilotris (Methylene Phosphonic Acid)), HEDP (Hydroxyethylidene Diphosphonic Acid), PBTC (Phosphonobutane Tricarboxylic Acid), and EDTMP (Ethylene Diamine Tetra(Methylene Phosphonic Acid)).

The semiconductor substrate cleaning method of the eleventh present invention is the semiconductor substrate cleaning method according to any of the first to tenth present inventions, wherein a sum of a concentration of the adsorptive inhibitor is 0.0003 mol/L to 1.3 mol/L at a time of the contact with the semiconductor substrate.

The semiconductor substrate cleaning method of the twelfth present invention is the semiconductor substrate cleaning method according to any of the first to eleventh present inventions, wherein the sulfuric acid solution comprising an oxidant is one or more selected from the group consisting of a sulfuric acid electrolytic solution, a mixed solution of sulfuric acid and hydrogen peroxide, and a mixed solution of sulfuric acid and ozone.

The semiconductor substrate cleaning method of the thirteenth present invention is the semiconductor substrate cleaning method according to any of the first to twelfth present inventions, wherein a liquid temperature of the second solution or a mixed solution of the first solution and the second solution is 35 to 130° C. during the cleaning.

The semiconductor substrate cleaning method of the fourteenth present invention is the semiconductor substrate cleaning method according to any of the first to thirteenth present inventions, wherein a concentration of the sulfuric acid solution is 30 to 98% by mass during the cleaning.

Of the semiconductor substrate cleaning systems of the present invention, the fifteenth present invention is a semiconductor substrate cleaning system comprising:

a cleaning portion for cleaning a semiconductor substrate in which Al is at least partially exposed on a silicon substrate and which is silicided with a metallic substance;

a delivery portion disposed in the cleaning portion for delivering a cleaning solution to the cleaning portion to bring the cleaning solution into contact with the semiconductor substrate;

a first solution transfer path through which a first solution comprising one or more adsorptive inhibitors having any one or more of N-based, S-based, and P-based polar groups is transferred to the delivery portion; and a second solution transfer path through which a second solution comprising as a cleaning component a sulfuric acid solution comprising an oxidant is transferred to the delivery portion.

The semiconductor substrate cleaning system of the sixteenth present invention is the semiconductor substrate cleaning system according to the fifteenth present invention, wherein the delivery portion is arranged so that delivery of the first solution and delivery of the second solution can be started at the same time, or the delivery of the first solution can be started first.

The semiconductor substrate cleaning system of the seventeenth present invention is the semiconductor substrate cleaning system according to the fifteenth or sixteenth present invention, wherein the system is arranged so that an oxidant concentration in the cleaning solution is 0.001 to 2 mol/L in cleaning on the semiconductor substrate.

The semiconductor substrate cleaning system of the eighteenth present invention is the semiconductor substrate cleaning system according to any of the fifteenth to seventeenth present inventions, wherein the delivery portion has a first solution delivery portion to which the first solution transfer path is connected, and a second solution delivery portion to which the second solution transfer path is connected, and the first solution delivery portion and the second solution delivery portion are disposed so that the first solution delivered from the first solution delivery portion and the second solution delivered from the second solution delivery portion are mixed on the semiconductor substrate.

The semiconductor substrate cleaning system of the nineteenth present invention is the semiconductor substrate cleaning system according to any of the fifteenth to eighteenth present inventions, comprising a common transfer path in which the first solution transfer path and the second solution transfer path meet and which is connected to the delivery portion.

The semiconductor substrate cleaning system of the twentieth present invention is the semiconductor substrate cleaning system according to the nineteenth present invention, comprising a mixing tank which is provided in the common transfer path or to which the first solution transfer path and the second solution transfer path are connected and in which the first solution and the second solution are mixed.

The semiconductor substrate cleaning system of the twenty-first present invention is the semiconductor substrate cleaning system according to any of the fifteenth to twentieth present inventions, comprising a heating portion provided in the delivery portion for heating one or both of the first solution and the second solution.

The semiconductor substrate cleaning system of the twenty-second present invention is the semiconductor substrate cleaning system according to any of the fifteenth to twenty-first present inventions, wherein the cleaning portion is a sheet type.

It is presumed that according to the present invention, any of N-based, S-based, and P-based polar groups of the adsorptive inhibitor of the first solution is adsorbed on Al on the semiconductor substrate, a suitable film is formed, and Al etching suppression is performed. By the contact of the second solution comprising as a cleaning agent a sulfuric acid solution comprising an oxidant with this semiconductor substrate, the cleaning of the semiconductor substrate is performed in a state in which the etching of Al is suppressed. In the present invention, the N-based, S-based, or P-based polar group refers to a polar atomic group in which N, S, or P is at the center (an amino group, a phosphonic acid group, or the like).

As long as the above action is obtained, it does not matter whether the first solution and the second solution are used alone or in a mixed state. In other words, it is possible to first start the use of the first solution and then use the second solution, or mix and use the first solution and the second solution. In addition, these can be combined. In addition, in a stage in which the etching of Al does not proceed to a predetermined extent or more, it is also possible to first use the second solution and then use the first solution.

The semiconductor substrate that is a target to be cleaned in the present invention is a semiconductor substrate in which Al is at least partially exposed on a silicon substrate and which is silicided with a metallic substance such as a metal or an alloy. The method for manufacturing the semiconductor substrate is not particularly limited as the present invention, and those manufactured by various methods can be targets. In addition, the form in which Al is present is also not particularly limited. Examples thereof include a form in which all or part of Al is directly exposed. Further, the form can be a form in which Al is not directly exposed, and a protective film or the like is present in the upper layer, and Al is exposed to a solution by the penetration of the solution. The silicon substrate in the present invention refers to one in which silicon is at least partially exposed on a substrate surface, and a deposit can be laminated on the substrate.

The second solution used in the present invention comprises as a cleaning component a sulfuric acid solution comprising an oxidant and can be the second solution composed of these, or the second solution comprising another component such as hydrochloric acid or nitric acid.

As the sulfuric acid solution comprising an oxidant, a sulfuric acid electrolytic solution, a mixed solution of sulfuric acid and hydrogen peroxide, a mixed solution of sulfuric acid and ozone, or the like can be selected. In addition, the sulfuric acid solution comprising an oxidant can be a mixed solution comprising a sulfuric acid electrolytic solution.

As persulfuric acid, peroxodisulfuric acid and peroxomonosulfuric acid are illustrated, and the persulfuric acid can be either one or a mixture of both. At this time, as the oxidant, persulfuric acid and hydrogen peroxide generated with the self-decomposition of persulfuric acid account for a substantially total amount.

It is desired that the oxidant has a concentration of 0.001 to 2 mol/L during cleaning.

In a state of being mixed with the first solution described later, the concentration in the mixed solution corresponds to the concentration during cleaning.

At an oxidant concentration of less than 0.001 mol/L, the cleaning power is insufficient. When the oxidant concentration is more than 2 mol/L, the etching rate increases, and practical use is difficult. In addition, when the second solution together with the first solution temporarily comes into contact with the semiconductor substrate, and further, only the second solution temporarily comes into contact with the semiconductor substrate, it is desired that the above oxidant concentration is satisfied in each case.

In the sulfuric acid solution, the sulfuric acid concentration during cleaning is desirably set to be 30 to 98% by mass, and is more preferably 60% by mass or more for the reason that cleaning can be performed at higher temperature.

In a state of being mixed with the first solution described later, the concentration in the mixed solution corresponds to the concentration during cleaning.

The first solution is a solution comprising one or more adsorptive inhibitors having any one or more of N-based, S-based, and P-based polar groups. As this adsorptive inhibitor, those having complexing ability, particularly chelating ability, are preferred. Examples thereof can include those comprising a phosphonic acid group. For example, one or two or more of NTMP (Nitrilotris (Methylene Phosphonic Acid)), HEDP (Hydroxyethylidene Diphosphonic Acid), PBTC (Phosphonobutane Tricarboxylic Acid), and EDTMP (Ethylene Diamine Tetra(Methylene Phosphonic Acid)) are illustrated.

It is desired that the adsorptive inhibitor is adjusted so that the sum of the adsorptive inhibitor concentration is 0.0003 mol/L to 1.3 mol/L at the time of contact with the semiconductor.

In a state of being mixed with the second solution, the concentration in the mixed solution corresponds to the adsorptive inhibitor concentration. When the first solution alone is supplied to the semiconductor substrate, the concentration in the first solution corresponds to the adsorptive inhibitor concentration.

In addition, when only the first solution temporarily comes into contact with the semiconductor substrate, and further, the first solution together with the second solution temporarily comes into contact with the semiconductor substrate, it is desired that the above adsorptive inhibitor concentration is satisfied in each case.

It is possible that for the first solution and the second solution, at different times, the first solution is first started to be used, and then, the second solution is used, and each is brought into contact with the semiconductor substrate. In this case, the second solution can be brought into contact with the semiconductor substrate during contact with the first solution, and the first solution and the second solution can be brought into contact with the semiconductor substrate at the same time.

In addition, when the first solution and the second solution are mixed, the mixing position can be on the semiconductor substrate to be cleaned, and the first solution and the second solution can be previously line-mixed or mixed in a tank such as a mixing tank before cleaning.

The point is that when the semiconductor substrate is cleaned, both liquids are mixed and come into contact with the semiconductor substrate. In this case, in order to prevent the adsorptive inhibitor from being consumed before coming into contact with the film formed for silicidation, it is preferred that the first solution and the second solution are mixed and brought to a liquid temperature of 35° C. or more and then subjected to cleaning within 10 minutes (preferably 5 minutes). When a sulfuric acid electrolytic solution is used as the second solution, it is desired that the sulfuric acid electrolytic solution is mixed in the process of being supplied to the use side because when the adsorptive inhibitor having a phosphonic acid group is mixed into the electrolytic cell, the electrolytic solution storage tank, or its circulation line, an adverse effect is exerted.

It is desired that the mixed solution to be brought into contact with the semiconductor substrate is brought into contact with the above semiconductor substrate with the liquid temperature being a temperature of 35° C. or more, preferably 40° C. or more.

This is because at less than 35° C., the cleaning ability is insufficient, and when the liquid temperature is 40° C. or more, the cleaning ability is substantially sufficient. On the other hand, the upper limit of the liquid temperature can be a temperature of 130° C. or less, but is more preferably a temperature of 110° C. or less in terms of energy efficiency and the etching rate.

When the liquid temperature is adjusted, the mixed solution has the above temperature when it is brought into contact with the semiconductor substrate.

In addition, the cleaning can be a batch type or a sheet type, but a sheet type is more preferred in terms of contact efficiency.

Advantageous Effect of Invention

In other words, according to the present invention, by the use of the solution comprising one or more adsorptive inhibitors having any one or more of N-based, S-based, and P-based polar groups and the sulfuric acid solution comprising an oxidant, the semiconductor substrate can be effectively cleaned without harming Al and the silicide film on the semiconductor substrate.

DESCRIPTION OF EMBODIMENTS

Embodiment 1

Figure 1:
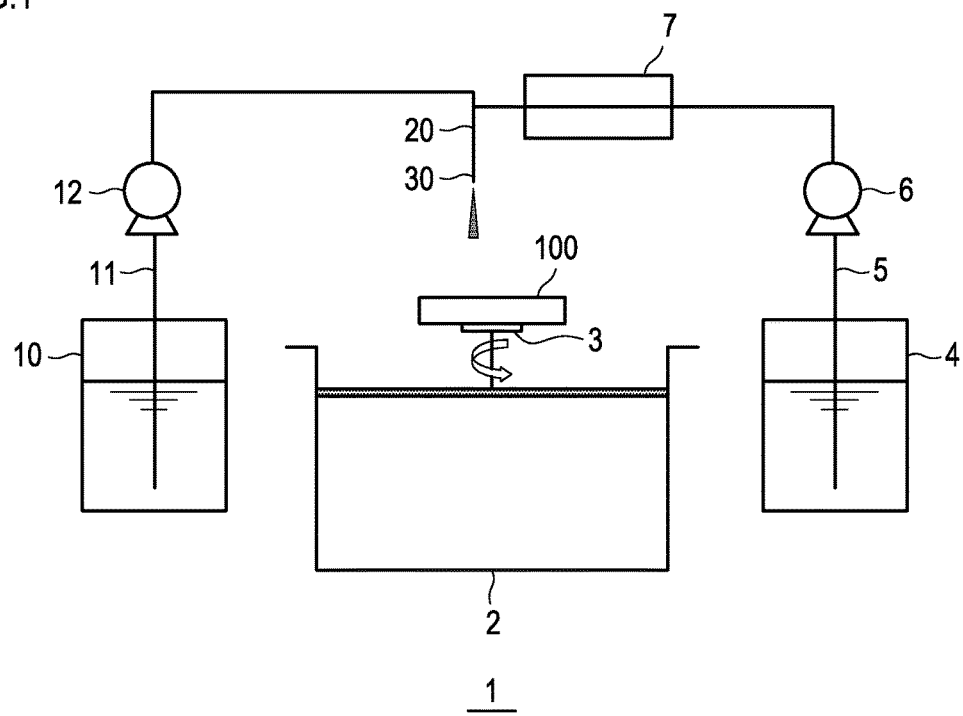
FIG. 1 is a diagram showing a semiconductor substrate cleaning system in one embodiment of the present invention.

A semiconductor substrate cleaning system 1 in one embodiment of the present invention will be described below based on FIG. 1.

The semiconductor substrate cleaning system 1 comprises a sheet type cleaning machine 2 corresponding to the cleaning portion of the present invention, a sulfuric acid solution storage tank 4 for storing a sulfuric acid solution comprising an oxidant (persulfuric acid in this form), and an adsorptive inhibitor solution storage tank 10 for storing a solution comprising an adsorptive inhibitor having any one or more of N-based, S-based, and P-based polar groups (an adsorptive inhibitor having a phosphonic acid group in this form). The sulfuric acid solution comprising persulfuric acid corresponds to a second solution, and the solution comprising an adsorptive inhibitor having a phosphonic acid group corresponds to a first solution.

The sheet type cleaning machine 2 comprises a semiconductor substrate support 3, and the semiconductor substrate support 3 can be rotationally driven by a drive not shown. The sheet type cleaning machine 2 corresponds to the cleaning portion of the present invention and comprises a delivery nozzle 30 for delivering a cleaning solution to a semiconductor substrate 100 supported on the semiconductor substrate support 3. The delivery nozzle 30 corresponds to the delivery portion of the present invention and sprays, drops, or flows the cleaning solution onto the semiconductor substrate 100. In the dropping or flowing, pressure can be applied to blow the solution onto the semiconductor substrate 100.

A sulfuric acid solution transfer path 5 is connected to the sulfuric acid solution storage tank 4. The sulfuric acid solution transfer path 5 corresponds to a second solution transfer path. In addition, an adsorptive inhibitor solution transfer path 11 is connected to the adsorptive inhibitor solution storage tank 10. The adsorptive inhibitor solution transfer path 11 corresponds to a first solution transfer path. In the sulfuric acid solution transfer path 5, a liquid feed pump 6 is provided, and a heater 7 for transiently heating the transferred sulfuric acid solution is provided on the downstream side of the liquid feed pump 6. The heater 7 corresponds to the heating portion of the present invention. A liquid feed pump 12 is provided in the transfer path 11 for a solution of an adsorptive inhibitor having a phosphonic acid group.

The sulfuric acid solution transfer path 5 and the adsorptive inhibitor solution transfer path 11 meet on the downstream side of the heater 7 and the liquid feed pump 12 and constitute a common transfer path 20 that is common, and the downstream end of the common transfer path 20 is connected to the delivery nozzle 30.

Next, a semiconductor substrate cleaning method using the semiconductor substrate cleaning system 1 will be described below.

First, the semiconductor substrate 100 in which Al is partially exposed on a silicon substrate and which is silicided with Ni and Pt is supported on the semiconductor substrate support 3. For the semiconductor substrate 100, for example, a semiconductor substrate can be used which is obtained by forming a metal film on a silicon substrate in which Al is present and performing annealing treatment on the above silicon substrate to form a silicide layer comprising a metal on the silicon substrate.

However, as the present invention, the method for manufacturing the semiconductor substrate 100 is not limited to this, and any semiconductor substrate in which Al is at least partially exposed on a silicon substrate and which is silicided with a metallic substance (a metal or an alloy) can be a target to be cleaned.

An example of a target preferred in this embodiment is a case where the film thickness of Al is 60 nm or less (preferably 30 nm or less), the thickness of a silicide layer is 60 nm or less (preferably 25 nm or less), and the gate width is 45 nm or less (preferably 30 nm or less) because as the film thickness of Al and the gate width become smaller, the allowable amount of Al etching becomes smaller. However, the semiconductor substrate that is a target in the present invention is not limited to this.

In addition, in the sulfuric acid solution storage tank 4 is contained a sulfuric acid solution adjusted so that the concentration of an oxidant comprising at least persulfuric acid is 0.001 to 2 mol/L and the sulfuric acid concentration is 30 to 98% by mass in a solution obtained by mixing with a solution of an adsorptive inhibitor having a phosphonic acid group described later.

The sulfuric acid solution comprising an oxidant can be stored by a batch type in the sulfuric acid solution storage tank 4, and the sulfuric acid solution comprising an oxidant can be continuously replenished corresponding to the amount consumed. The sulfuric acid solution comprising persulfuric acid as an oxidant can be preferably efficiently replenished with a sulfuric acid electrolytic solution.

On the other hand, in the adsorptive inhibitor solution storage tank 10, adjustment is performed so that the sum of the concentration of the adsorptive inhibitor having a phosphonic acid group is 0.0003 mol/L to 1.3 mol/L in a solution obtained by mixing with the above sulfuric acid solution comprising persulfuric acid. As the adsorptive inhibitor having a phosphonic acid group, for example, one or two or more of NTMP (Nitrilotris (Methylene Phosphonic Acid)), HEDP (Hydroxyethylidene Diphosphonic Acid), PBTC (Phosphonobutane Tricarboxylic Acid), and EDTMP (Ethylene Diamine Tetra(Methylene Phosphonic Acid)) can be preferably used.

In the cleaning of the semiconductor substrate 100, the semiconductor substrate support 3 is rotationally driven to rotationally support the semiconductor substrate 100, and the sulfuric acid solution comprising persulfuric acid in the sulfuric acid solution storage tank 4 is fed at a predetermined flow rate through the sulfuric acid solution transfer path 5 by the liquid feed pump 6, and the solution comprising an adsorptive inhibitor having a phosphonic acid group in the adsorptive inhibitor solution storage tank 10 is fed at a predetermined flow rate through the adsorptive inhibitor solution transfer path 11 by the liquid feed pump 12. Both liquids are mixed in the common transfer path 20 where both transfer paths meet. The flow rate of the sulfuric acid solution and the flow rate of the solution of an adsorptive inhibitor having a phosphonic acid group are set so that a predetermined mixing ratio is reached when both liquids are mixed, and the flow rate of the mixed solution is a predetermined amount.

In addition, in this embodiment, the sulfuric acid solution comprising persulfuric acid transferred through the sulfuric acid solution transfer path 5 is transiently heated by the heater 7 before meeting. The heating temperature is adjusted so that the liquid temperature is a temperature of 35 to 130° C. when the mixed solution is brought into contact with the semiconductor substrate 100 after the mixing of the solution of an adsorptive inhibitor having a phosphonic acid group. In this embodiment, only the sulfuric acid solution is heated, but a heater can be provided in the transfer path 11 for a solution of an adsorptive inhibitor having a phosphonic acid group to heat the solution of an adsorptive inhibitor having a phosphonic acid group, or heating can be performed in the common transfer path 20. In any case, it is desired that adjustment is performed so that the liquid temperature is a temperature of 35 to 130° C. on the semiconductor substrate 100.

The sulfuric acid solution comprising persulfuric acid and the solution comprising an adsorptive inhibitor having a phosphonic acid group are delivered from the delivery nozzle 30 and come into contact with the semiconductor substrate 100 in a state in which the concentration of the oxidant is 0.001 to 2 mol/L, the sum concentration of the adsorptive inhibitor having a phosphonic acid group is 0.0003 mol/L to 1.3 mol/L, the sulfuric acid concentration is 30 to 98% by mass, and the liquid temperature is 35 to 130° C. in the mixed solution, and the cleaning of the semiconductor substrate 100 is performed. It is desired that the liquid feed rate and the length of the common transfer path 20 are determined so that the sulfuric acid solution comprising persulfuric acid and the solution of an adsorptive inhibitor having a phosphonic acid group come into contact with the semiconductor substrate 100 within 10 minutes (preferably 5 minutes) from a point of time when a liquid temperature of 35° C. or more is reached in the mixed state.

At this time, it is desired that cleaning is performed under such a condition that the etching rate of Al is 200 Å/min or less, preferably 150 Å/min or less, and cleaning is performed under such a condition that the cleaning time is within about 120 seconds, preferably within 100 seconds.

The details of action in the above cleaning will be described below.

<NiPt Stripping>

The mechanism of this reaction is not clear but is presumed as follows.

By the contact of persulfuric acid with NiPt (silicide residue) on the surface of the silicon substrate, not only Ni but Pt is strongly ionized, and thus, the residue metal can be removed. It is presumed that at this time, the re-adhesion of the residue metal ionized and removed from the substrate can be prevented by the action of the adsorptive inhibitor.

It is considered that when the adsorptive inhibitor is of a type having complexing ability, persulfuric acid reacts with the adsorptive inhibitor, and the reaction product comes into contact with NiPt to form a complex, and the removal rate of NiPt improves. For a similar reason, the adsorptive inhibitor more preferably has chelating ability (the number of coordination positions of the ligand is plural; for example, having a phosphonic acid group in the compound).

Although depending on the exposed state of Al, at a predetermined liquid temperature of 35° C. or more, the adsorptive inhibitor can sufficiently promote NiPt removal even at a low concentration of about 0.0003 mol/L.

<Al Etching Suppression>

The mechanism of this reaction is not clear but is presumed as follows.

It is considered that by using the cleaning liquid comprising an adsorptive inhibitor, an atom of N, S, or P having large electronegativity constituting the polar group of the adsorptive inhibitor is adsorbed on Al on the semiconductor substrate to form an adsorbed film in a form in which a hydrocarbon group constituting a nonpolar group at the other end is exposed on the liquid side, and thus, substrate cleaning can be performed while the etching of Al with the cleaning liquid is suppressed. However, it is considered that the adsorbed film is stripped by the oxidizing power of persulfuric acid, and therefore, in substrate cleaning with persulfuric acid, it is performed in a state in which the adsorptive inhibitor is mixed, and by performing substrate cleaning while constantly regenerating the adsorbed film, the effect of Al etching suppression is continuously obtained.

In addition, it is considered that by improving NiPt removal performance as described above, substrate cleaning can be performed while the oxidant concentration and the temperature of the cleaning liquid are kept low, and therefore, the etching of Al can be further suppressed.

However, when the adsorptive inhibitor has complexing ability, the reaction product of persulfuric acid and the adsorptive inhibitor forms a complex not only with the residue metal but also with Al, and etching is easily performed, and therefore, it is preferred that the amount of the adsorptive inhibitor added is kept within bounds so that the adsorptive inhibitor is not excessively added, for example, 1.3 mol/L or less is reached.

<Suppression of Silicide Damage>

In addition, solutions capable of stripping NiPt include aqua regia, but the aqua regia has a high concentration of Cl, which is considered as a cause of harming a silicide, and therefore harms a silicide. But, the mixed solution in this embodiment is an adsorptive inhibitor having a phosphonic acid group and therefore can suppress silicide damage.

<Reduction of Treatment Time>

In this embodiment, when treatment is performed in one stage, the time can be more reduced and the apparatus and operation are also simpler than when treatment is performed in two stages.

Embodiment 2

Next, Embodiment 2 will be described based on FIG. 2. Structures similar to those in Embodiment 1 are denoted by the same numerals, and their description is omitted or simplified.

A semiconductor substrate cleaning system 1a comprises a sheet type cleaning machine 2, a sulfuric acid solution storage tank 4, and an adsorptive inhibitor solution storage tank 10.

A sulfuric acid solution transfer path 5 is connected to the sulfuric acid solution storage tank 4, and an adsorptive inhibitor solution transfer path 11 is connected to the adsorptive inhibitor solution storage tank 10. The sulfuric acid solution transfer path 5 and the adsorptive inhibitor solution transfer path 11 meet and constitute a common transfer path 20 that is common, and the downstream end of the common transfer path 20 is connected to a delivery nozzle 30. A liquid feed pump 6 is provided in the sulfuric acid solution transfer path 5 on the upstream side of the common transfer path 20, and a liquid feed pump 12 is provided in the adsorptive inhibitor solution transfer path 11 on the upstream side of the common transfer path 20. In addition, a heater 8 for heating a stored sulfuric acid solution comprising persulfuric acid is provided in the sulfuric acid solution storage tank 4.

Next, a semiconductor substrate cleaning method using the semiconductor substrate cleaning system 1a will be described below.

First, a semiconductor substrate 100 is supported on the semiconductor substrate support 3 of the sheet type cleaning machine 2 as in Embodiment 1.

In the sulfuric acid solution storage tank 4 is contained a sulfuric acid solution adjusted so that the concentration of an oxidant is 0.001 to 2 mol/L and the sulfuric acid concentration is 30 to 98% by mass in a state of a mixed solution as in Embodiment 1. In the adsorptive inhibitor solution storage tank 10, adjustment is performed so that the sum of the concentration of an adsorptive inhibitor having a phosphonic acid group is 0.0003 mol/L to 1.3 mol/L in a state of a mixed solution as in Embodiment 1.

In the cleaning of the semiconductor substrate 100, the semiconductor substrate support 3 is rotationally driven to rotationally support the semiconductor substrate 100, and the sulfuric acid solution comprising persulfuric acid in the sulfuric acid solution storage tank 4 is fed at a predetermined flow rate through the sulfuric acid solution transfer path 5 by the liquid feed pump 6, the solution of an adsorptive inhibitor having a phosphonic acid group in the adsorptive inhibitor solution storage tank 10 is fed at a predetermined flow rate through the adsorptive inhibitor solution transfer path 11 by the liquid feed pump 12, and both liquids are mixed in the common transfer path 20 where both transfer paths meet. The flow rate of the sulfuric acid solution and the flow rate of the solution of an adsorptive inhibitor having a phosphonic acid group are set so that a predetermined mixing ratio is reached when both liquids are mixed, and the flow rate of the mixed solution is a predetermined amount, as in the above Embodiment 1.

In addition, the sulfuric acid solution comprising persulfuric acid is heated by the heater 8 in the sulfuric acid solution storage tank 4 and adjusted so that the liquid temperature is a temperature of 35 to 130° C. at the time of contact with the semiconductor substrate 100.

The sulfuric acid solution comprising persulfuric acid and the solution of an adsorptive inhibitor having a phosphonic acid group are delivered from the delivery nozzle 30 and come into contact with the semiconductor substrate 100 in a state in which the concentration of the oxidant is 0.001 to 2 mol/L, the sum concentration of the adsorptive inhibitor having a phosphonic acid group is 0.0003 mol/L to 1.3 mol/L, the sulfuric acid concentration is 30 to 98% by mass, and the liquid temperature is 35 to 130° C. in the mixed solution, and the cleaning of the semiconductor substrate 100 is performed. It is desired that the liquid feed rate and the length of the common transfer path 20 are determined so that the sulfuric acid solution comprising persulfuric acid and the solution of an adsorptive inhibitor having a phosphonic acid group come into contact with the semiconductor substrate 100 within 10 minutes (preferably within 5 minutes) from a point of time when the mixed solution in the common transfer path 21 reaches a liquid temperature of 35° C. or more.

At this time, it is desired that cleaning is performed under such a condition that the etching rate of Al is 200 Å/min or less, preferably 150 Å/min or less, and cleaning is performed under such a condition that the cleaning time is within about 120 seconds, preferably within 100 seconds.

Embodiment 3

Figure 3:
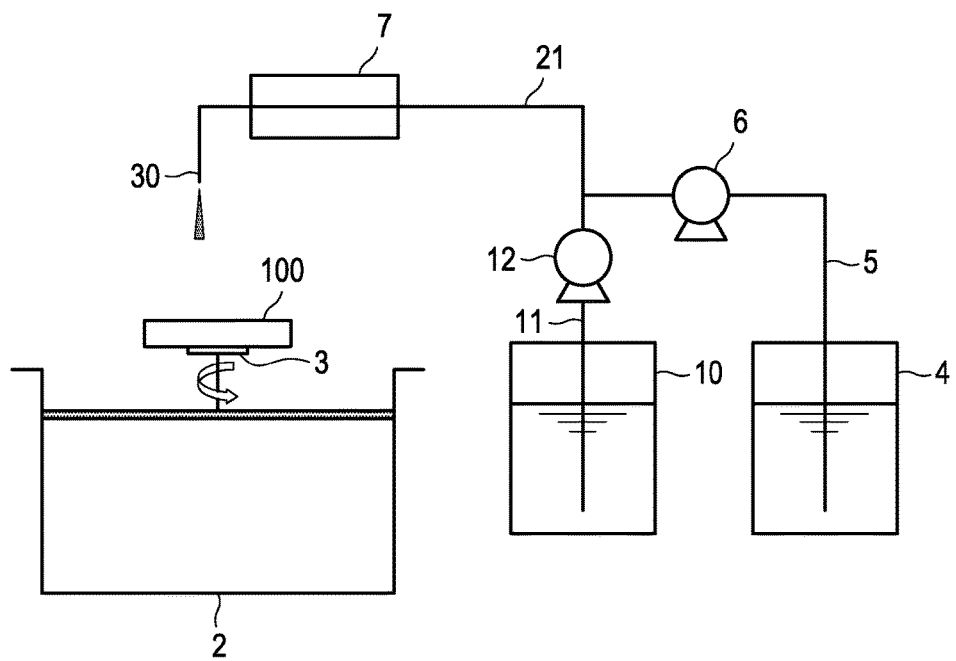
FIG. 3 is a diagram showing a semiconductor substrate cleaning system in a still another embodiment as well.

Next, Embodiment 3 will be described based on FIG. 3. Structures similar to those in Embodiment 1 are denoted by the same numerals, and their description is omitted or simplified.

A semiconductor substrate cleaning system 1b comprises a sheet type cleaning machine 2, a sulfuric acid solution storage tank 4, and an adsorptive inhibitor solution storage tank 10.

A sulfuric acid solution transfer path 5 is connected to the sulfuric acid solution storage tank 4, and an adsorptive inhibitor solution transfer path 11 is connected to the adsorptive inhibitor solution storage tank 10. The sulfuric acid solution transfer path 5 and the adsorptive inhibitor solution transfer path 11 meet and constitute a common transfer path 21 that is common, and the downstream end of the common transfer path 21 is connected to a delivery nozzle 30. A liquid feed pump 6 is provided in the sulfuric acid solution transfer path 5 on the upstream side of the common transfer path 21, and a liquid feed pump 12 is provided in the adsorptive inhibitor solution transfer path 11 on the upstream side of the common transfer path 21. In addition, a heater 7 for heating a fed mixed solution is provided in the common transfer path 21.

Next, a semiconductor substrate cleaning method using the semiconductor substrate cleaning system 1b will be described below.

First, a semiconductor substrate 100 is supported on the semiconductor substrate support 3 of the sheet type cleaning machine 2 as in Embodiment 1.

In the sulfuric acid solution storage tank 4 is contained a sulfuric acid solution adjusted so that the concentration of an oxidant is 0.001 to 2 mol/L and the sulfuric acid concentration is 30 to 98% by mass in a state of a mixed solution as in Embodiment 1. In the adsorptive inhibitor solution storage tank 10, adjustment is performed so that the sum of the concentration of an adsorptive inhibitor having a phosphonic acid group is 0.0003 mol/L to 1.3 mol/L in a state of a mixed solution as in Embodiment 1.

In the cleaning of the semiconductor substrate 100, the semiconductor substrate support 3 is rotationally driven to rotationally support the semiconductor substrate 100, and the sulfuric acid solution comprising persulfuric acid in the sulfuric acid solution storage tank 4 is fed at a predetermined flow rate through the sulfuric acid solution transfer path 5 by the liquid feed pump 6, the solution of an adsorptive inhibitor having a phosphonic acid group in the adsorptive inhibitor solution storage tank 10 is fed at a predetermined flow rate through the adsorptive inhibitor solution transfer path 11 by the liquid feed pump 12, and both liquids are mixed in the common transfer path 21 where both transfer paths meet. The flow rate of the sulfuric acid solution and the flow rate of the solution of an adsorptive inhibitor having a phosphonic acid group are set so that a predetermined mixing ratio is reached when both liquids are mixed, and the flow rate of the mixed solution is a predetermined amount, as in the above Embodiment 1.

In addition, the mixed solution of the sulfuric acid solution comprising persulfuric acid and the solution of an adsorptive inhibitor having a phosphonic acid group transferred through the common transfer path 21 is transiently heated by the heater 7 and adjusted so that the liquid temperature is a temperature of 35 to 130° C. when the mixed solution is brought into contact with the semiconductor substrate 100. In this embodiment, the heating temperature can also be a temperature in this range.

The sulfuric acid solution comprising persulfuric acid and the solution of an adsorptive inhibitor having a phosphonic acid group are delivered from the delivery nozzle 30 and come into contact with the semiconductor substrate 100 in a state in which the concentration of the oxidant is 0.001 to 2 mol/L, the sum concentration of the adsorptive inhibitor having a phosphonic acid group is 0.0003 mol/L to 1.3 mol/L, the sulfuric acid concentration is 30 to 98% by mass, and the liquid temperature is 35 to 130° C. in the mixed solution, and the cleaning of the semiconductor substrate 100 is performed. It is desired that the liquid feed rate and the length of the common transfer path 21 are determined so that the sulfuric acid solution comprising persulfuric acid and the solution of an adsorptive inhibitor having a phosphonic acid group come into contact with the semiconductor substrate 100 within 10 minutes (preferably within 5 minutes) from a point of time when the mixed solution in the common transfer path 21 reaches a liquid temperature of 35° C. or more.

At this time, it is desired that cleaning is performed under such a condition that the etching rate of Al is 200 Å/min or less, preferably 150 Å/min or less, and cleaning is performed under such a condition that the cleaning time is within about 120 seconds, preferably within 100 seconds.

Embodiment 4

Next, a semiconductor substrate cleaning system 1c in Embodiment 4 will be described based on FIG. 4. Structures similar to those in Embodiment 1 are denoted by the same numerals, and their description is omitted or simplified.

In this embodiment, a sulfuric acid solution transfer path 5 and an adsorptive inhibitor solution transfer path 11 are connected to a mixing tank 25, and a common transfer path 22 connected to the mixing tank 25 is connected to a delivery nozzle 30. A mixing tank heater 26 is provided in the mixing tank 25, and a heater 7 is provided in the common transfer path 22.

In this Embodiment 4, a sulfuric acid solution comprising persulfuric acid is transferred from a sulfuric acid solution storage tank 4 to the mixing tank 25 through the sulfuric acid solution transfer path 5 by a liquid feed pump 6, and a solution of an adsorptive inhibitor having a phosphonic acid group is transferred from an adsorptive inhibitor solution storage tank 10 to the mixing tank 25 through the adsorptive inhibitor solution transfer path 11 by a liquid feed pump 12 so that a predetermined mixing ratio is obtained in the mixing tank 25.

The solution in the mixing tank 25 is adjusted so that the concentration of the oxidant is 0.001 to 2 mol/L, the sum concentration of the adsorptive inhibitor having a phosphonic acid group is 0.0003 mol/L to 1.3 mol/L, and the sulfuric acid concentration is 30 to 98% by mass. The adjustment can be performed by the oxidant concentration, sulfuric acid concentration, and fed amount of the sulfuric acid solution in the sulfuric acid solution storage tank 4, and the concentration and fed amount of the adsorptive inhibitor having a phosphonic acid group in the storage tank 10 for a solution of an adsorptive inhibitor having a phosphonic acid group.

The solution in the mixing tank 25 is heated by the mixing tank heater 26 as required and transferred through the common transfer path 22 by a liquid feed pump 23. At this time, the mixed solution is transiently heated by the heater 7 to adjust liquid temperature when the mixed solution is brought into contact with a semiconductor substrate 100 to 35 to 130° C. When the solution is heated by the mixing tank heater 26, the heating load on the heater 7 can be reduced. However, it is desired that the heating temperature in the mixing tank 25 is kept down to 50° C. or less so that the self-decomposition of persulfuric acid and the halogen sulfate compound does not proceed too much. The mixed solution comes into contact with the semiconductor substrate 100, and thus, the cleaning of the semiconductor substrate 100 is performed.

At this time, it is desired that cleaning is performed under such a condition that the etching rate of Al is 200 Å/min or less, preferably 150 Å/min or less, and cleaning is performed under such a condition that the cleaning time is within about 120 seconds, preferably within 100 seconds.

It is desired that the tank volume of the mixing tank 25, the liquid feed rate from the mixing tank 25, and the length of the common transfer path 22 are determined so that the sulfuric acid solution comprising persulfuric acid and the solution of an adsorptive inhibitor having a phosphonic acid group come into contact with the semiconductor substrate 100 within 10 minutes (preferably within 5 minutes) from a point of time when the mixed solution is passed through the heater 7 and started to be heated after the sulfuric acid solution comprising persulfuric acid and the solution of an adsorptive inhibitor having a phosphonic acid group are mixed in the mixing tank 25. In the heater 7, when the solution is passed and started to be heated by rapid heating, a predetermined liquid temperature of 35° C. or more is immediately reached.

Embodiment 5

In the above Embodiments 1 to 4, it has been described that the sulfuric acid solution comprising persulfuric acid and the solution of an adsorptive inhibitor having a phosphonic acid group are mixed, then transferred, and brought into contact with the semiconductor substrate 100, but the sulfuric acid solution comprising persulfuric acid and the solution of an adsorptive inhibitor having a phosphonic acid group can be transferred through different paths and mixed on the semiconductor substrate 100.

A semiconductor substrate cleaning system 1d in this Embodiment 5 will be described based on FIG. 5. Structures similar to those in Embodiment 1 are denoted by the same numerals, and their description is omitted or simplified.

In this embodiment, as in Embodiments 1 to 4, a sulfuric acid solution storage tank 4 and an adsorptive inhibitor solution storage tank 10 are provided, and the oxidant concentration and sulfuric acid concentration of a sulfuric acid solution comprising persulfuric acid contained in the sulfuric acid solution storage tank 4 are adjusted, and the total ion concentration of an adsorptive inhibitor having a phosphonic acid group contained in the adsorptive inhibitor solution storage tank 10 is adjusted.

A sulfuric acid solution delivery nozzle 31 is connected to the downstream end of a sulfuric acid solution transfer path 5 connected to the sulfuric acid solution storage tank 4, and an adsorptive inhibitor solution delivery nozzle 32 is connected to the downstream end of an adsorptive inhibitor solution transfer path 11 connected to the adsorptive inhibitor solution storage tank 10. It is desired that for the sulfuric acid solution delivery nozzle 31 and the adsorptive inhibitor solution delivery nozzle 32, the attachment positions and attachment angles are set so that delivered respective solutions are efficiently mixed on the semiconductor substrate 100. The sulfuric acid solution delivery nozzle 31 corresponds to a second solution delivery nozzle, and the adsorptive inhibitor solution delivery nozzle 32 corresponds to a first solution delivery nozzle.

In addition, the flow rates of the solutions are determined so that the sulfuric acid solution comprising persulfuric acid transferred through the sulfuric acid solution transfer path 5 so that a predetermined mixing ratio is obtained, and the solution of an adsorptive inhibitor having a phosphonic acid group transferred through the adsorptive inhibitor solution transfer path 11 are mixed at a predetermined mixing ratio, and the total amount of the delivered solutions is a predetermined amount.

Also in this embodiment, each solution feds onto the semiconductor substrate 100 are mixed on the semiconductor substrate 100, and as in the above embodiments respectively, the cleaning of the semiconductor substrate 100 can be performed well while the etching of Al is suppressed. In this form, a step in which a first solution and a second solution mix, and the step of bringing the mixed solution into contact with a semiconductor substrate to clean the semiconductor substrate are performed in the same step. The time of the completion of the delivery of the sulfuric acid solution comprising persulfuric acid from the sulfuric acid solution delivery nozzle 31 and the time of the completion of the delivery of the solution of an adsorptive inhibitor having a phosphonic acid group from the adsorptive inhibitor solution delivery nozzle 32 can be different. For example, it is possible to first complete the delivery of the solution of an adsorptive inhibitor having a phosphonic acid group from the adsorptive inhibitor solution delivery nozzle 32, then perform alone the delivery of the sulfuric acid solution comprising persulfuric acid from the sulfuric acid solution delivery nozzle 31, and then complete the delivery of the sulfuric acid solution comprising persulfuric acid.

In the above Embodiment 5, it has been described that the sulfuric acid solution comprising persulfuric acid and the solution of an adsorptive inhibitor having a phosphonic acid group are delivered from the sulfuric acid solution delivery nozzle 31 and the adsorptive inhibitor solution delivery nozzle 32 respectively at the same time, but time difference can be provided to the delivery of these.

For example, it is possible to first deliver a predetermined amount of the solution of an adsorptive inhibitor having a phosphonic acid group from the adsorptive inhibitor solution delivery nozzle 32 and then deliver a predetermined amount of the sulfuric acid solution comprising persulfuric acid from the sulfuric acid solution delivery nozzle 31 to perform the cleaning of the semiconductor substrate 100. At this time, delivery from the sulfuric acid solution delivery nozzle 31 is started with delivery from the adsorptive inhibitor solution delivery nozzle 32 continued.

In the above embodiments, the sheet type has been described as the cleaning portion, but as the present invention, the cleaning portion can be a batch type. The sheet type cleaning portion cleans one or several semiconductor substrates at a time, and particularly, those that spray, drop, or flow a cleaning solution onto a semiconductor substrate, or the like are illustrated. The batch type cleaning portion cleans a plurality of semiconductor substrates, and those in which a semiconductor substrate is immersed in a cleaning tank in which a cleaning solution is stored, for a predetermined time, are illustrated.

Example 1

The Examples and Comparative Examples of the present invention are shown below. In the Examples and Comparative Examples, cleaning was performed using the semiconductor substrate cleaning system 1a shown in FIG. 2 or the semiconductor substrate cleaning system 1c or 1d shown in FIG. 4 or FIG. 5.

In each cleaning, after heating and mixing, a mixed liquid is immediately (within 10 minutes) supplied for cleaning in which it comes into contact with a solid wafer described below.

A NiPt removal rate of 95% or more was evaluated as good, and a NiPt removal rate of less than 95% was evaluated as poor below.

For the etching rate of Al, more than 200 Å/min is evaluated as poor because Al is damaged, and 200 Å/min or less is evaluated as good.

In addition, for the presence or absence of silicide damage, an average surface roughness Ra of less than 1.9 μm was evaluated as there being no damage, and an Ra of 1.9 or more was evaluated as there being damage.

Comparative Example 1

Figure 2:
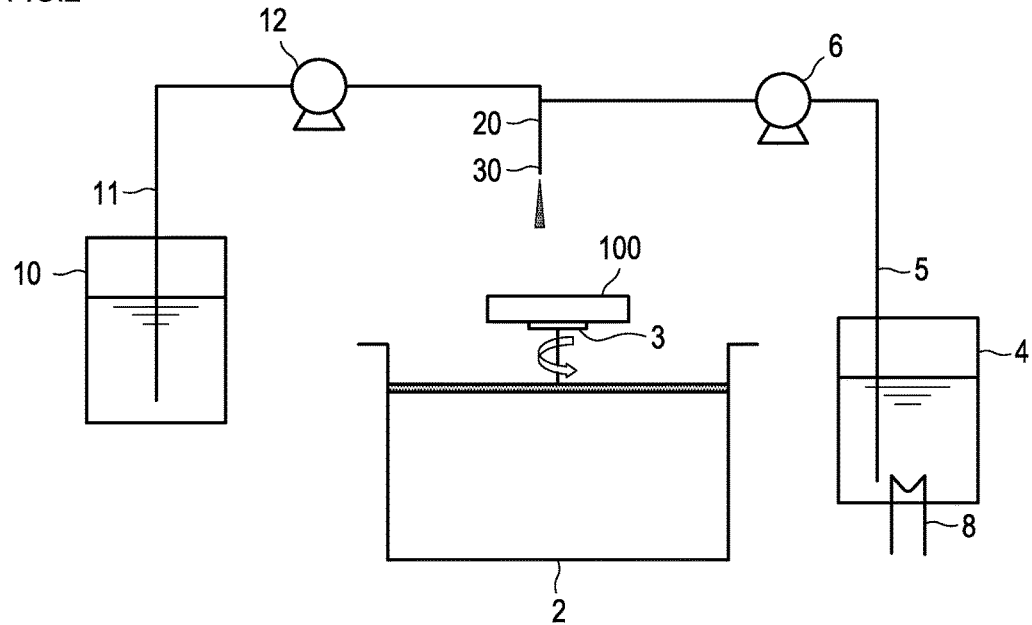
FIG. 2 is a diagram showing a semiconductor substrate cleaning system in another embodiment as well.

In the sheet type cleaning machine in FIG. 2, cleaning in which an electrolytic sulfuric acid solution (sulfuric acid concentration 70%, oxidant concentration 0.07 mol/L) was brought into contact with each of (1) a solid wafer in which a 10 nm NiPt layer was laminated on a silicon wafer and (2) a solid wafer in which a 500 nm Al layer was laminated on a silicon wafer at 200 ml/min for a test was carried out at 50° C. for 100 seconds. At this time, the supply of an adsorptive inhibitor from the adsorptive inhibitor solution transfer path 11 was not performed.

The solution after the treatment was subjected to component analysis using an ICP-MS (inductively coupled plasma mass spectrometer, hereinafter simply described as ICP-MS), and the removal rate of NiPt and the etching rate of Al for the wafers were confirmed from the concentrations of Ni, Pt, and Al in the solution. The wafer surface was observed by an AFM (Atomic Force Microscope, hereinafter simply described as AFM) to confirm the presence or absence of silicide damage. The results are shown in Table 1.

As a result, the NiPt removal rate was 20%, the Al etching rate was 80 Å/min, and there was no NiPt silicide damage.

Comparative Example 2

In the sheet type cleaning machine in FIG. 2, cleaning in which an electrolytic sulfuric acid solution (sulfuric acid concentration 70%, oxidant concentration 0.04 mol/L) was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. At this time, the supply of an adsorptive inhibitor from the adsorptive inhibitor solution transfer path 11 was not performed.

The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 10%, the Al etching rate was 70 Å/min, and there was no NiPt silicide damage.

Comparative Example 3

In the sheet type cleaning machine in FIG. 2, cleaning in which an SPM solution having an oxidant concentration of 2.14 mol/L and a sulfuric acid concentration of 67% ($H_2SO_4:H_2O_2=2:1$) was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. At this time, the supply of an adsorptive inhibitor from the adsorptive inhibitor solution transfer path 11 was not performed.

The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 60%, the Al etching rate was 400 Å/min, and there was no NiPt silicide damage.

Comparative Example 4

In the sheet type cleaning machine in FIG. 2, cleaning in which an SPM solution having an oxidant concentration of 0.71 mol/L and a sulfuric acid concentration of 80% ($H_2SO_4:H_2O_2=4:1$) was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. At this time, the supply of an adsorptive inhibitor from the adsorptive inhibitor solution transfer path 11 was not performed.

The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 50%, the Al etching rate was 300 Å/min, and there was no NiPt silicide damage.

Comparative Example 5

In the sheet type cleaning machine in FIG. 2, cleaning in which an SPM solution having an oxidant concentration of 0.41 mol/L and a sulfuric acid concentration of 83% ($H_2SO_4:H_2O_2=5:1$) was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. At this time, the supply of an adsorptive inhibitor from the adsorptive inhibitor solution transfer path 11 was not performed.

The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the Al etching rate was 150 Å/min, and there was no NiPt silicide damage, but the NiPt removal rate was 40% and insufficient.

Comparative Example 6

In the sheet type cleaning machine in FIG. 2, cleaning in which an SPM solution having an oxidant concentration of 0.18 mol/L and a sulfuric acid concentration of 90% ($H_2SO_4:H_2O_2=10:1$) was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. At this time, the supply of an adsorptive inhibitor from the adsorptive inhibitor solution transfer path 11 was not performed.

The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the Al etching rate was 100 Å/min, and there was no NiPt silicide damage, but the NiPt removal rate was 30% and insufficient.

Comparative Example 7

In the sheet type cleaning machine in FIG. 2, cleaning in which aqua regia was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 200 seconds. At this time, the supply of an adsorptive inhibitor from the adsorptive inhibitor solution transfer path 11 was not performed.

The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 450 Å/min, and there was NiPt silicide damage.

Comparative Example 8

In the sheet type cleaning machine in FIG. 2, cleaning in which an electrolytic sulfuric acid solution (sulfuric acid concentration 30%, oxidant concentration 0.07 mol/L) was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. At this time, the supply of an adsorptive inhibitor from the adsorptive inhibitor solution transfer path 11 was not performed.

The solution after the treatment was subjected to component analysis using an ICP-MS (inductively coupled plasma mass spectrometer, hereinafter simply described as ICP-MS), and the removal rate of NiPt and the etching rate of Al for the wafers were confirmed from the concentrations of Ni, Pt, and Al in the solution. The wafer surface was observed by an AFM (Atomic Force Microscope, hereinafter simply described as AFM) to confirm the presence or absence of silicide damage. The results are shown in Table 1.

As a result, the NiPt removal rate was 10%, the Al etching rate was 120 Å/min, and there was no NiPt silicide damage.

Comparative Example 9

In the sheet type cleaning machine in FIG. 2, cleaning in which an electrolytic sulfuric acid solution (sulfuric acid concentration 80%, oxidant concentration 0.07 mol/L) was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. At this time, the supply of an adsorptive inhibitor from the adsorptive inhibitor solution transfer path 11 was not performed.

The solution after the treatment was subjected to component analysis using an ICP-MS (inductively coupled plasma mass spectrometer, hereinafter simply described as ICP-MS), and the removal rate of NiPt and the etching rate of Al for the wafers were confirmed from the concentrations of Ni, Pt, and Al in the solution. The wafer surface was observed by an AFM (Atomic Force Microscope, hereinafter simply described as AFM) to confirm the presence or absence of silicide damage. The results are shown in Table 1.

As a result, the NiPt removal rate was 20%, the Al etching rate was 80 Å/min, and there was no NiPt silicide damage.

Reference Example 10

In the sheet type cleaning machine in FIG. 2, a mixed solution obtained by mixing with an electrolytic sulfuric acid solution (sulfuric acid concentration 70%, oxidant concentration 0.07 mol/L) at 20° C. such that the NTMP concentration was 0.03 mol/L was used. The liquid temperature, sulfuric acid concentration, and oxidant concentration due to the mixing were almost unchanged and the same as before the mixing. The same applies hereinafter. Cleaning in which the above mixed solution was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 20° C. for 100 seconds. The solution after the treatment was subjected to component analysis using an ICP-MS (inductively coupled plasma mass spectrometer, hereinafter simply described as ICP-MS), and the removal rate of NiPt and the etching rate of TiN for the wafers were confirmed from the concentrations of Ni, Pt, and Al in the solution. The wafer surface was observed by an AFM (Atomic Force Microscope, hereinafter simply described as AFM) to confirm the presence or absence of silicide damage. The results are shown in Table 1.

As a result, the NiPt removal rate was 10%, the Al etching rate was 50 Å/min, and there was no NiPt silicide damage.

Reference Example 11

In the sheet type cleaning machine in FIG. 2, cleaning in which a mixed solution obtained by mixing with an electrolytic sulfuric acid solution (sulfuric acid concentration 70%, oxidant concentration 0.07 mol/L) such that the NTMP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 150° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 1500 Å/min, and there was no NiPt silicide damage.

Example 1

In the sheet type cleaning machine in FIG. 2, cleaning in which a mixed solution obtained by mixing with an electrolytic sulfuric acid solution (sulfuric acid concentration 70%, oxidant concentration 0.07 mol/L) at 50° C. such that the NTMP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 90 Å/min, and there was no NiPt silicide damage.

Example 2

In the sheet type cleaning machine in FIG. 2, cleaning in which a mixed solution obtained by mixing with an electrolytic sulfuric acid solution (sulfuric acid concentration 70%, oxidant concentration 0.07 mol/L) at 50° C. such that the HEDP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 90 Å/min, and there was no NiPt silicide damage.

Example 3

In the sheet type cleaning machine in FIG. 2, cleaning in which a mixed solution obtained by mixing with an electrolytic sulfuric acid solution (sulfuric acid concentration 70%, oxidant concentration 0.07 mol/L) such that the PBTC concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 90 Å/min, and there was no NiPt silicide damage.

Example 4

In the sheet type cleaning machine in FIG. 2, cleaning in which a mixed solution obtained by mixing with an electrolytic sulfuric acid solution (sulfuric acid concentration 70%, oxidant concentration 0.07 mol/L) such that the EDTMP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 90 Å/min, and there was no NiPt silicide damage.

Example 5

In the sheet type cleaning machine in FIG. 2, cleaning in which a mixed solution obtained by mixing with an electrolytic sulfuric acid solution (sulfuric acid concentration 30%, oxidant concentration 0.07 mol/L) such that the NTMP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 120 Å/min, and there was no NiPt silicide damage.

Example 6

In the sheet type cleaning machine in FIG. 2, cleaning in which a mixed solution obtained by mixing with an electrolytic sulfuric acid solution (sulfuric acid concentration 90%, oxidant concentration 0.07 mol/L) such that the EDTMP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 80 Å/min, and there was no NiPt silicide damage.

Example 7

In the sheet type cleaning machine in FIG. 2, cleaning in which a mixed solution obtained by mixing with an electrolytic sulfuric acid solution (sulfuric acid concentration 70%, oxidant concentration 0.07 mol/L) at 50° C. such that the NTMP concentration was 0.0003 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS (inductively coupled plasma mass spectrometer, hereinafter simply described as ICP-MS), and the removal rate of NiPt and the etching rate of TiN for the wafers were confirmed from the concentrations of Ni, Pt, and Al in the solution. The wafer surface was observed by an AFM (Atomic Force Microscope, hereinafter simply described as AFM) to confirm the presence or absence of silicide damage. The results are shown in Table 1.

As a result, the NiPt removal rate was 95%, the Al etching rate was 90 Å/min, and there was no NiPt silicide damage.

Example 8

In the sheet type cleaning machine in FIG. 2, cleaning in which a mixed solution obtained by mixing with an electrolytic sulfuric acid solution (sulfuric acid concentration 70%, oxidant concentration 0.07 mol/L) such that the NTMP concentration was 0.0005 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 95 Å/min, and there was no NiPt silicide damage.

Example 9

In the sheet type cleaning machine in FIG. 2, cleaning in which a mixed solution obtained by mixing with an electrolytic sulfuric acid solution (sulfuric acid concentration 70%, oxidant concentration 0.07 mol/L) such that an NTMP concentration of 1.2 mol/L was reached was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 150 Å/min, and there was no NiPt silicide damage.

Example 10

In the sheet type cleaning machine in FIG. 2, a mixed solution obtained by mixing with an electrolytic sulfuric acid solution (sulfuric acid concentration 70%, oxidant concentration 0.07 mol/L) such that the NTMP concentration was 1.3 mol/L was used. The liquid temperature, sulfuric acid concentration, and oxidant concentration due to the mixing were almost unchanged and the same as before the mixing (the same applies hereinafter). Cleaning in which the above mixed solution was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 200 Å/min, and there was no NiPt silicide damage.

Example 11

In the sheet type cleaning machine in FIG. 2, cleaning in which a mixed solution obtained by mixing with an electrolytic sulfuric acid solution (sulfuric acid concentration 70%, oxidant concentration 0.07 mol/L) such that the EDTMP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 35° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 60 Å/min, and there was no NiPt silicide damage.

Example 12

In the sheet type cleaning machine in FIG. 2, cleaning in which a mixed solution obtained by mixing with an electrolytic sulfuric acid solution (sulfuric acid concentration 70%, oxidant concentration 0.07 mol/L) such that the EDTMP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 120° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 150 Å/min, and there was no NiPt silicide damage.

Example 13

In the sheet type cleaning machine in FIG. 2, cleaning in which a mixed solution obtained by mixing with an electrolytic sulfuric acid solution (sulfuric acid concentration 70%, oxidant concentration 1.80 mol/L) such that the NTMP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 140 Å/min, and there was no NiPt silicide damage.

Example 14

In the sheet type cleaning machine in FIG. 2, cleaning in which a mixed solution obtained by mixing with an electrolytic sulfuric acid solution (sulfuric acid concentration 70%, oxidant concentration 0.002 mol/L) such that the NTMP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 80 Å/min, and there was no NiPt silicide damage.

Example 15

In the sheet type cleaning machine in FIG. 2, cleaning in which a mixed solution obtained by mixing with an SPM solution having an oxidant concentration of 0.18 mol/L and a sulfuric acid concentration of 90% ($H_2SO_4$:$H_2O_2$=10:1) such that the NTMP concentration was 0.03 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds.

The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 110 Å/min, and there was no NiPt silicide damage.

Example 16

Figure 4:
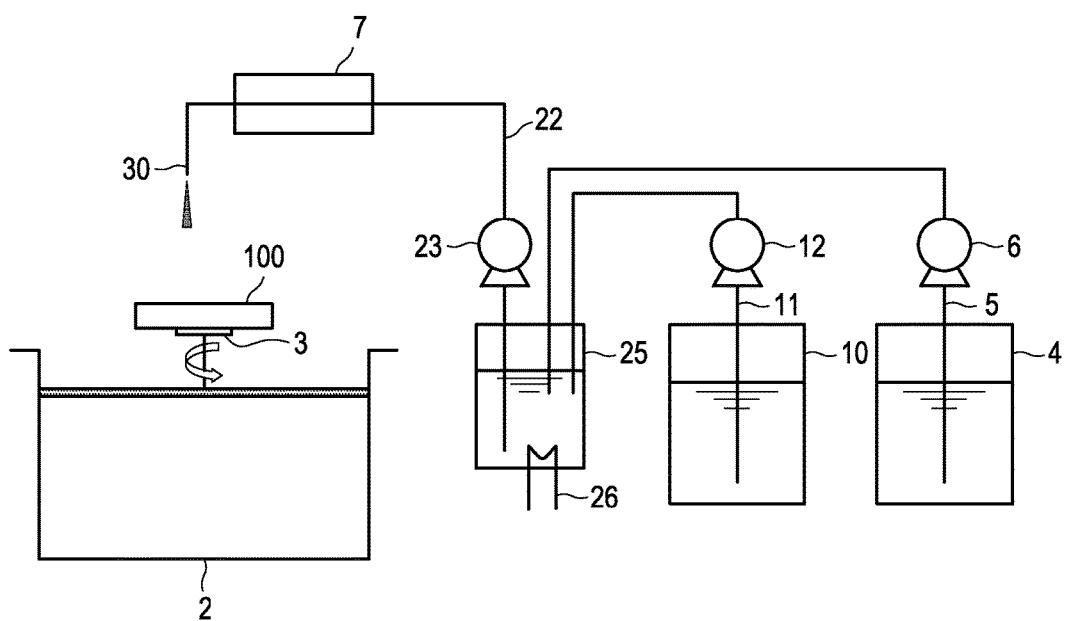
FIG. 4 is a diagram showing a semiconductor substrate cleaning system in a still another embodiment as well.

In the sheet type cleaning machine in FIG. 4, with a sulfuric acid solution obtained by adding ozone gas to a 70% sulfuric acid solution to set the oxidant concentration to 0.002 mol/L, mixing was performed so that an NTMP concentration of 0.03 mol/L was reached. The sulfuric acid concentration and oxidant concentration due to the mixing were almost unchanged and the same as before the mixing. Cleaning in which the mixed liquid heated to 50° C. was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 100 Å/min, and there was no NiPt silicide damage.

Example 17

Figure 5:
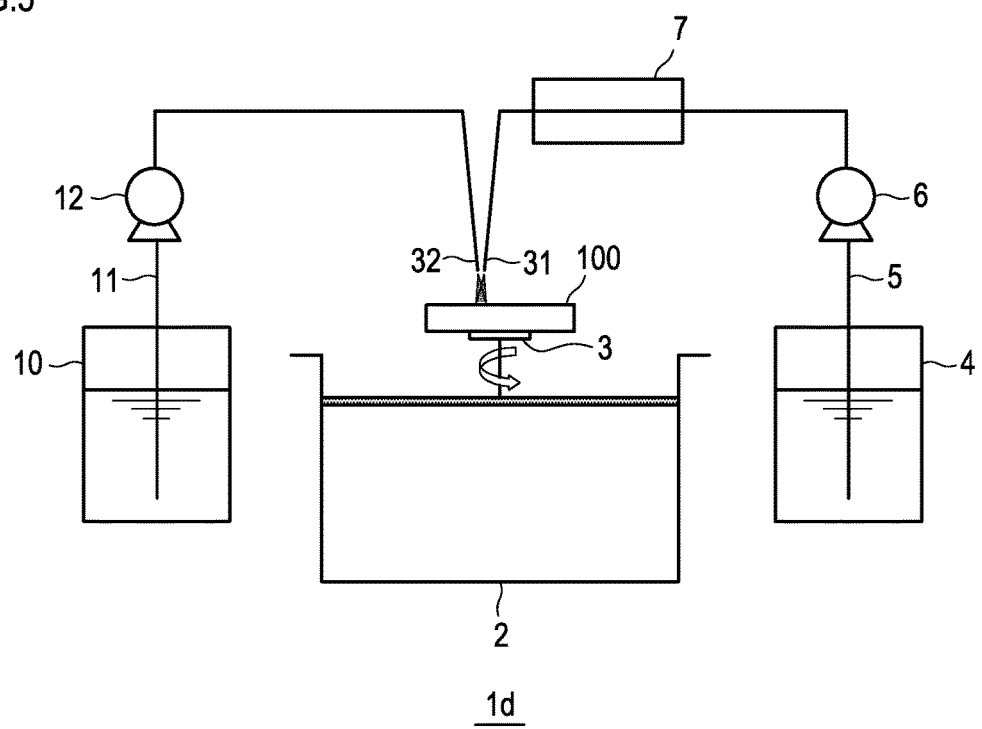
FIG. 5 is a diagram showing a semiconductor substrate cleaning system in a still another embodiment as well.

In the sheet type cleaning machine in FIG. 5, cleaning in which a mixed solution obtained by simultaneous mixing with an electrolytic sulfuric acid solution (sulfuric acid concentration 70%, oxidant concentration 0.07 mol/L) on a semiconductor substrate such that an NTMP concentration of 0.03 mol/L was reached was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 100 seconds. The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 90 Å/min, and there was no NiPt silicide damage.

(Example 18) Step 1 (Adsorptive Inhibitor Alone)→Step 2 (Electrolytic Sulfuric Acid+Adsorptive Inhibitor)

In the sheet type cleaning machine in FIG. 5, first, cleaning in which a solution of an adsorptive inhibitor having an NTMP concentration of 1.2 mol/L was brought into contact with each of (1) a solid wafer in which a 10 nm NiPt layer was laminated on a silicon wafer and (2) a solid wafer in which a 500 nm Al layer was laminated on a silicon wafer at 200 ml/min was carried out at 50° C. for 20 seconds. At this time, the supply of an electrolytic sulfuric acid solution from the sulfuric acid solution transfer path 5 was not performed.

Then, cleaning in which a mixed solution obtained by mixing with an electrolytic sulfuric acid solution (sulfuric acid concentration 70%, oxidant concentration 0.07 mol/L) at 50° C. such that the NTMP concentration was 0.03 mol/L was similarly brought into contact with each of the (1) and (2) solid wafers at 200 ml/min was carried out at 50° C. for 80 seconds. At this time, the supply of the solution of the adsorptive inhibitor from the adsorptive inhibitor solution transfer path 11 was continuously performed.

The solution after the treatment was subjected to component analysis using an ICP-MS, and the removal rate of NiPt and the etching rate of Al for the wafers were confirmed from the concentrations of Ni, Pt, and Al in the solution. The wafer surface was observed by an AFM to confirm the presence or absence of silicide damage. They are shown in Table 1.

As a result, the NiPt removal rate was 100%, the Al etching rate was 90 Å/min, and there was no NiPt silicide damage. In addition, it was noted that by previously bringing the substrate into contact with the adsorptive inhibitor to form an adsorbed film before persulfuric acid cleaning, the time of persulfuric acid cleaning was reduced.

TABLE 1

| Sample No. | | Solution | Concentration of the oxidant [mol/L] | Adsorptive inhibitor concentration [mol/L] | Sulfuric acid concentration [%] | Temperature [° C.] | Treatment Time [sec] | NiPt removal rate [%] | Al etching rate [Å/min] | NiPt silicide damage | Remarks |
|---|---|---|---|---|---|---|---|---|---|---|---|
| Comparative Examples | 1 | Electrolytic sulfuric acid | 0.07 | 0 | 70 | 50 | 100 | 20 | 80 | No | Adsorptive inhibitor |
| | 2 | Electrolytic sulfuric acid | 0.04 | 0 | 70 | 50 | 100 | 10 | 70 | No | No |
| | 3 | SPM2:1 | 2.14 | 0 | 67 | 50 | 100 | 60 | 400 | No | |
| | 4 | SPM4:1 | 0.71 | 0 | 80 | 50 | 100 | 50 | 300 | No | |
| | 5 | SPM5:1 | 0.41 | 0 | 83 | 50 | 100 | 40 | 150 | No | |

TABLE 1-continued

| | Sample No. | Solution | Concentration of the oxidant [mol/L] | Adsorptive inhibitor concentration [mol/L] | Sulfuric acid concentration [%] | Temperature [° C.] | Treatment Time [sec] | NiPt removal rate [%] | Al etching rate [Å/min] | NiPt silicide damage | Remarks |
|---|---|---|---|---|---|---|---|---|---|---|---|
| | 6 | SPM10:1 | 0.18 | 0 | 90 | 50 | 100 | 30 | 100 | No | |
| | 7 | Aqua regia | — | 0 | 0 | 50 | 200 | 100 | 450 | Yes | |
| | 8 | Electrolytic sulfuric acid | 0.07 | 0 | 30 | 50 | 100 | 10 | 120 | No | Adsorptive inhibitor |
| | 9 | Electrolytic sulfuric acid | 0.07 | 0 | 80 | 50 | 100 | 20 | 80 | No | No Consideration of sulfuric acid concentration |
| Reference Example | 10 | Electrolytic sulfuric acid + NTMP | 0.07 | 0.03 | 70 | 20 | 100 | 10 | 50 | No | Adsorptive inhibitor Yes |
| | 11 | Electrolytic sulfuric acid + NTMP | 0.07 | 0.03 | 70 | 150 | 100 | 100 | 1500 | No | Consideration of Temperature |
| Example | 1 | Electrolytic sulfuric acid + NTMP | 0.07 | 0.03 | 70 | 50 | 100 | 100 | 90 | No | Adsorptive inhibitor Yes |
| | 2 | Electrolytic sulfuric acid + HEDP | 0.07 | 0.03 | 70 | 50 | 100 | 100 | 90 | No | Consideration of a type of agent |
| | 3 | Electrolytic sulfuric acid + PBTC | 0.07 | 0.03 | 70 | 50 | 100 | 100 | 90 | No | |
| | 4 | Electrolytic sulfuric acid + EDTMP | 0.07 | 0.03 | 70 | 50 | 100 | 100 | 90 | No | |
| | 5 | Electrolytic sulfuric acid + NTMP | 0.07 | 0.03 | 30 | 50 | 100 | 100 | 120 | No | Absorptive inhibitor Yes |
| | 6 | Electrolytic sulfuric acid + EDTMP | 0.07 | 0.03 | 90 | 50 | 100 | 100 | 80 | No | Consideration of sulfuric acid concentration |
| | 7 | Electrolytic sulfuric acid + NTMP | 0.07 | 0.0003 | 70 | 50 | 100 | 95 | 90 | No | Adsorptive inhibitor Yes |
| | 8 | Electrolytic sulfuric acid + NTMP | 0.07 | 0.0005 | 70 | 50 | 100 | 100 | 95 | No | Consideration of concentration |
| | 9 | Electrolytic sulfuric acid + NTMP | 0.07 | 1.2 | 70 | 50 | 100 | 100 | 150 | | |
| | 10 | Electrolytic sulfuric acid + NTMP | 0.07 | 1.3 | 70 | 50 | 100 | 100 | 200 | No | |
| | 11 | Electrolytic sulfuric acid + EDTMP | 0.07 | 0.03 | 70 | 35 | 100 | 100 | 60 | No | Absorptive inhibitor Yes |
| | 12 | Electrolytic sulfuric acid + EDTMP | 0.07 | 0.03 | 70 | 120 | 100 | 100 | 150 | No | Consideration of Temperature |
| | 13 | Electrolytic sulfuric acid + NTMP | 1.80 | 0.03 | 70 | 50 | 100 | 100 | 140 | No | Absorptive inhibitor Yes |
| | 14 | Electrolytic sulfuric acid + NTMP | 0.002 | 0.03 | 70 | 50 | 100 | 100 | 80 | No | Concentration of the oxidant |
| | 15 | SPM10:1 + NTMP | 0.18 | 0.03 | 90 | 50 | 100 | 100 | 110 | No | Absorptive inhibitor Yes |
| | 16 | Electrolytic + Ozone + NTMP | 0.002 | 0.03 | 70 | 50 | 100 | 100 | 100 | No | Consideration of a type of solution |
| | 17 | Mix simultaneously the electrolytic sulfuric acid and NTMP on the substrate | 0.07 | 0.03 | 70 | 50 | 100 | 100 | 90 | No | |
| | 18 | 1.NTMP 2.Electrolytic sulfuric acid + NTMP | — 0.07 | 1.2 0.03 | — 70 | 50 50 | 20 80 | 100 | 90 | No | |

The present invention has been described above based on the above embodiments and Examples, but the present invention is not limited to the contents of the above embodiments and Examples, and appropriate changes can be made without departing from the scope of this invention.

REFERENCE SIGNS LIST

1 Semiconductor substrate cleaning system
1a Semiconductor substrate cleaning system
1b Semiconductor substrate cleaning system
1c Semiconductor substrate cleaning system
1d Semiconductor substrate cleaning system
2 Sheet type cleaning machine
3 Semiconductor substrate support
4 Sulfuric acid solution storage tank
5 Sulfuric acid solution transfer path
6 Liquid feed pump
7 Heater
8 Heater
10 Adsorptive inhibitor solution storage tank
11 Adsorptive inhibitor solution transfer path
12 Liquid feed pump
20 Common transfer path
21 Common transfer path
22 Common transfer path
26 Mixing tank heater
30 Delivery nozzle
31 Sulfuric acid solution delivery nozzle
32 Adsorptive inhibitor solution delivery nozzle
100 Semiconductor substrate

The invention claimed is:

1. A method for cleaning a semiconductor substrate in which Al is at least partially exposed on a silicon substrate and which is silicided with a metallic substance, comprising:
bringing the semiconductor substrate into contact with a first solution comprising one or more adoptive inhibitors having any one or more of N-based, S-based and P-based polar groups; and
cleaning the semiconductor substrate with a second solution comprising as a cleaning component a sulfuric acid solution comprising an oxidant wherein a liquid temperature of the second solution or a mixed solution of the first solution and the second solution is 35 to 130° C. during the cleaning.

2. The semiconductor substrate cleaning method according to claim 1, wherein a concentration of the oxidant during the cleaning is 0.001 to 2 mol/L.

3. The semiconductor substrate cleaning method according to claim 1, wherein for the first solution and the second solution, the first solution is first started to be used, and then, the second solution is used in the presence of the first solution, or the first solution and the second solution are mixed and used.

4. The semiconductor substrate cleaning method according to claim 3, wherein in mixing the first solution and the second solution, the first solution and the second solution are mixed to provide a mixed solution before being brought into contact with the semiconductor substrate or the first solution and the second solution are supplied to the semiconductor substrate through separate paths and mixed with each other on the semiconductor substrate.

5. The semiconductor substrate cleaning method according to claim 1, wherein the metallic substance is any one or more selected from the group consisting of Ti, V, Cr, Co, Ni, Fe, Zr, Nb, Mo, Pd, Pt, Pt, Hf, Ta, W and Ir.

6. The semiconductor substrate cleaning method according to claim 5, wherein the metallic substance comprises Pt or an alloy thereof.

7. The semiconductor substrate cleaning method according to claim 6, wherein at least one of the adsorptive inhibitors has complexing ability with Pt.

8. The semiconductor substrate cleaning method according to claim 7, wherein at least one of the adsorptive inhibitors has chelating ability with Pt.

9. The semiconductor substrate cleaning method according to claim 8, wherein at least one of the adsorptive inhibitors has a phosphonic acid group.

10. The semiconductor substrate cleaning method according to claim 9, wherein the adsorptive inhibitors is any one of NTMP (Nitrilotris Methylene Phosphonic Acid)), HEDP (Hydroxyethylidene Disphosphonic Acid), PBTC (Phosphonobutane Tricarboxylic Acid), and EDTMP (Ethylene Diamine Tetra (Methylene Phospheric Acid)).

11. The semiconductor substrate cleaning method according to claim 1, wherein a sum of a concentration of the adsorptive inhibitor is 0.0003 mol/L to 1.3 mol/L at a time of the contact with the semiconductor substrate.

12. The semiconductor substrate cleaning method according to claim 1, wherein the sulfuric acid solution is comprising an oxidant is one or more selected from the group consisting of a sulfuric acid electrolytic solution, a mixed solution of sulfuric acid and hydrogen peroxide, and a mixed solution of sulfuric acid and ozone.

13. The semiconductor substrate cleaning method according to claim 1, wherein a concentration of the sulfuric acid solution is 30 to 98% by mass during the cleaning.

* * * * *